United States Patent [19]
Darmawan

[11] Patent Number: 5,786,222
[45] Date of Patent: Jul. 28, 1998

[54] METHOD OF MANUFACTURING HIGH PERFORMANCE BIPOLAR TRANSISTORS IN A BICMOS PROCESS

[75] Inventor: Johan A. Darmawan, Santa Clara, Calif.

[73] Assignee: National Semiconductor Corporation, Santa Clara, Calif.

[21] Appl. No.: 655,055

[22] Filed: Aug. 30, 1996

Related U.S. Application Data

[62] Division of Ser. No. 285,315, Aug. 3, 1994, Pat. No. 5,594,268.

[51] Int. Cl.$^6$ ................................................ H01L 21/265
[52] U.S. Cl. .................. 437/31; 437/59; 437/186; 148/DIG. 50; 148/DIG. 124
[58] Field of Search .................... 437/31, 59, 186; 148/DIG. 9, DIG. 10, DIG. 11, DIG. 50, DIG. 124

[56] References Cited

U.S. PATENT DOCUMENTS

| | | |
|---|---|---|
| 4,939,104 | 7/1990 | Pollack et al. . |
| 4,975,381 | 12/1990 | Shin-Ichi et al. . |
| 4,983,531 | 1/1991 | Cosentino ................................ 437/31 |
| 5,045,493 | 9/1991 | Kameyama et al. ............... 148/DIG. 9 |
| 5,147,809 | 9/1992 | Tae-Young et al. . |
| 5,324,672 | 6/1994 | Anmo et al. .................... 148/DIG. 10 |
| 5,403,757 | 4/1995 | Suzuki . |
| 5,444,285 | 8/1995 | Robinson et al. . |
| 5,516,708 | 5/1996 | Li et al. ................................... 437/31 |

FOREIGN PATENT DOCUMENTS 0 451 632   10/1991   European Pat. Off. .

Primary Examiner—John Niebling
Assistant Examiner—Long Pham
Attorney, Agent, or Firm—Skjerven, Morrill, MacPherson, Franklin & Friel LLP; Ken J. Koestner

[57] ABSTRACT

A BiCMOS manufacturing process for fabricating an emitter of a bipolar transistor includes the steps of forming footings on a silicon substrate for prospectively bearing edges of the emitter, forming a polysilicon emitter having a medial portion overlying the silicon substrate and lateral edges on the footings, removing the footings leaving notches at the lateral edges of the polysilicon emitter and refilling the notches with a thin polysilicon film. The bipolar transistor in a BiCMOS integrated circuit resulting from this process includes a silicon semiconductor substrate having a substantially flat surface, a field oxide film laterally bounding the silicon semiconductor substrate and a polysilicon emitter abutting the flat surface of the silicon semiconductor substrate.

42 Claims, 15 Drawing Sheets

1

METHOD OF MANUFACTURING HIGH PERFORMANCE BIPOLAR TRANSISTORS IN A BICMOS PROCESS

This application is a division of application Ser. No. 08/285,315, filed Aug. 3, 1994, now U.S. Pat No. 5,594,268.

BACKGROUND OF THE INVENTION

1. Field of the Invention

The present invention relates to integrated circuits and more specifically to a method of manufacturing a bipolar transistor in a single polysilicon BiCMOS technology.

2. Description of the Related Art

BiCMOS integrated circuits combine bipolar junction transistors and complementary MOS (CMOS) transistors on a single chip (integrated circuit), furnishing a variety of functionality and exploiting the advantages of each type of process. Thus BiCMOS integrated circuits capitalize on the relatively fast speed and better analog performance of bipolar transistors while exploiting the low power dissipation and high packing densities of CMOS transistors.

An integrated circuit which is fabricated using one conventional BiCMOS technology is shown in FIG. 1. A BiCMOS integrated circuit 100 includes a silicon wafer substrate 102 having a bipolar region 128 and a MOS region 130 which are separated by regions of field oxide 104, 106 and 108. (Note that field oxide is made of silicon dioxide, which is commonly referred to as "oxide"). The BiCMOS integrated circuit 100 is fabricated by oxidizing a surface of the integrated circuit 100 to form a thin layer of gate oxide 118 on the surface of the silicon wafer substrate 102 and the field oxide regions 104, 106 and 108. A thin layer of polysilicon 120 is deposited over the gate oxide layer 118, extending throughout the integrated circuit 100 surface. A layer of photoresist is applied to the surface of the polysilicon layer 120, masked and removed so that the layers of gate oxide 118 and thin polysilicon 120 remain only at the positions of a bipolar transistor 160 and a CMOS transistor 162. Thus, a bipolar gate oxide layer 170 and a bipolar thin polysilicon layer 172 remain at the position of the bipolar transistor 160 and a CMOS gate oxide layer 180 and a CMOS thin polysilicon layer 182 remain at the position of the CMOS transistor 162. A thick layer of polysilicon 124 is deposited over the BiCMOS integrated circuit 100 surface. A layer of photoresist is applied to the surface of the thick polysilicon layer 124, masked and etched so that the layer of thick polysilicon 124 is positioned only over the bipolar gate oxide layer 170 and bipolar thin polysilicon layer 172 to form an emitter 110 at the position of the bipolar transistor 160 and positioned over CMOS gate oxide layer 180 and CMOS thin polysilicon layer 182 to form a gate 190 at the position of the CMOS transistor 162.

One disadvantage of a BiCMOS circuit 100 that utilizes this approach is that the base resistance ($R_b$) of the bipolar transistor is increased due to bipolar gate oxide layer 170 and bipolar thin polysilicon layer 172. These layers prevent adequate doping of the substrate beneath the emitter using ion implantation or lightly doped drain (LDD) implants, resulting in a lightly doped area under a non-active emitter at the emitter edges. Bipolar gate oxide layer 170 and bipolar thin polysilicon layer 172 are used in the fabrication process to set an end point to the etching process that is used to form the emitter 110 and the gate 190. Without such an end point, the polysilicon etching process would continue to etch into the substrate 102 which is also made of silicon.

To avoid this increase in $R_b$, an alternative conventional BiCMOS fabrication process has been employed in which the etching process for forming a bipolar emitter and a CMOS gate does not attempt to set an end point at the polysilicon/silicon boundary but rather allows trenching into the silicon substrate. An integrated circuit which is fabricated using this alternative conventional BiCMOS technology is shown in FIG. 2. This BiCMOS integrated circuit 200 also includes a silicon wafer substrate 202 having a bipolar region 228 and a MOS region 230 and separating regions of field oxide 204, 206 and 208. The BiCMOS integrated circuit 202 is also fabricated by oxidizing the integrated circuit 200 to form a thin layer of gate oxide 218 and depositing a thin layer of polysilicon 220. However, in this process a layer of photoresist is applied to the surface of the polysilicon layer 220, masked and removed so that the layers of gate oxide 218 and thin polysilicon layer 220 remain only at the positions of a CMOS transistor 262. Thus, only a CMOS gate oxide layer 280 and a CMOS thin polysilicon layer 282 remain at the position of the CMOS transistor 262. A thick layer of polysilicon 224 is deposited over the BiCMOS integrated circuit 200 surface and a layer of photoresist is applied to the surface of the thick polysilicon layer 224, masked and over-etched so that the layer of thick polysilicon 224 is positioned only over the substrate 202 to form an emitter 210 at the position of the bipolar transistor 260 and positioned over CMOS gate oxide layer 280 and CMOS thin polysilicon layer 282 to form a gate 290 at the position of the CMOS transistor 262. The over-etching process for bipolar emitter 210 forms trenches 250 into substrate 202.

The BiCMOS process using trenching thus greatly reduces the increase in base resistance $R_b$ of the bipolar transistor. However, the trenching into the silicon substrate causes various problems which affect the ability to manufacture bipolar transistors that operate in a consistent manner. The concentration of the etching agent and the physical conditions of the etching process must be tightly controlled so that the fabricated BiCMOS circuits have similar operating characteristics. Tight control of the manufacturing process is difficult to achieve, as is evidenced by trench depths across a single wafer that commonly vary by 20–30%. The trenching process must be precisely controlled, not only to avoid trenches that are too deep, but also to avoid a degree of over-etching that is insufficient.

Excessive over-etching is disadvantageous because characteristics of the emitter/base junction of a bipolar transistor, including a propensity for short-circuiting, are influenced by the relative angle of the lateral sides of the emitter with respect to the surface of the substrate, called the vertical profile of the emitter. It is advantageous to have a vertical profile in which the sides of the emitter are perpendicular to the substrate surface. The vertical profile of the emitter, i.e., the tapering of the foot of the polysilicon emitter, is controlled when the polysilicon etch endpoints on an oxide layer. As a trench penetrates deeper into the substrate, a vertical profile cannot be attained.

Furthermore, if the over-etch is excessive and the trench is sufficiently deep that the emitter-base junction connection is impaired or essentially severed, the base resistance $R_b$ is raised to a level that disrupts or terminates operability of the transistor.

If the over-etch is insufficient, subsequent deposition of polysilicon can create bridging between the emitter and base via what are called polysilicon stringers. This occurs due to the isotropic/anisotropic nature of the etching process and leads to short-circuiting of the emitter-base junction. The over-etch must be sufficient to prevent polysilicon stringers but not so excessive that $R_b$ is increased.

An additional problem arising in BiCMOS technology is that over-etching should be precisely controlled for both bipolar and CMOS transistors but that the amount of over-etching for each transistor type is not always the same. For example, a desired amount of over-etching for a MOS transistor having a gate overlying a thin layer of polysilicon and a layer of gate oxide is different from an appropriate amount of over-etching for a bipolar transistor having a polysilicon emitter adjacent to silicon substrate.

SUMMARY OF THE INVENTION

It is advantageous for a process of manufacturing BiCMOS integrated circuits to furnish precise control of etching and over-etching of bipolar transistor structures.

It is advantageous in a bipolar transistor of a BICMOS integrated circuit to have a polysilicon bipolar emitter which abuts the silicon substrate but does not require trenching into the substrate. It is advantageous for a BiCMOS process to fabricate bipolar transistors having this structure.

These and other advantages are attained by a BiCMOS manufacturing process for fabricating an emitter of a bipolar transistor, which includes the step of forming footings on a silicon substrate for prospectively bearing edges of the emitter. The footings including a silicon dioxide layer and a silicon nitride layer. Further steps of the process include forming a polysilicon emitter having a medial portion overlying the silicon substrate and lateral edges on the footings, removing the footings leaving notches at the lateral edges of the polysilicon emitter, and refilling the notches with a thin polysilicon film.

The bipolar transistor in a BiCMOS integrated circuit resulting from this process includes a silicon semiconductor substrate having a substantially flat surface, a field oxide film laterally bounding the silicon semiconductor substrate, and a polysilicon emitter abutting the flat surface of the silicon semiconductor substrate.

DETAILED DESCRIPTION OF THE INVENTION

Figure 1:
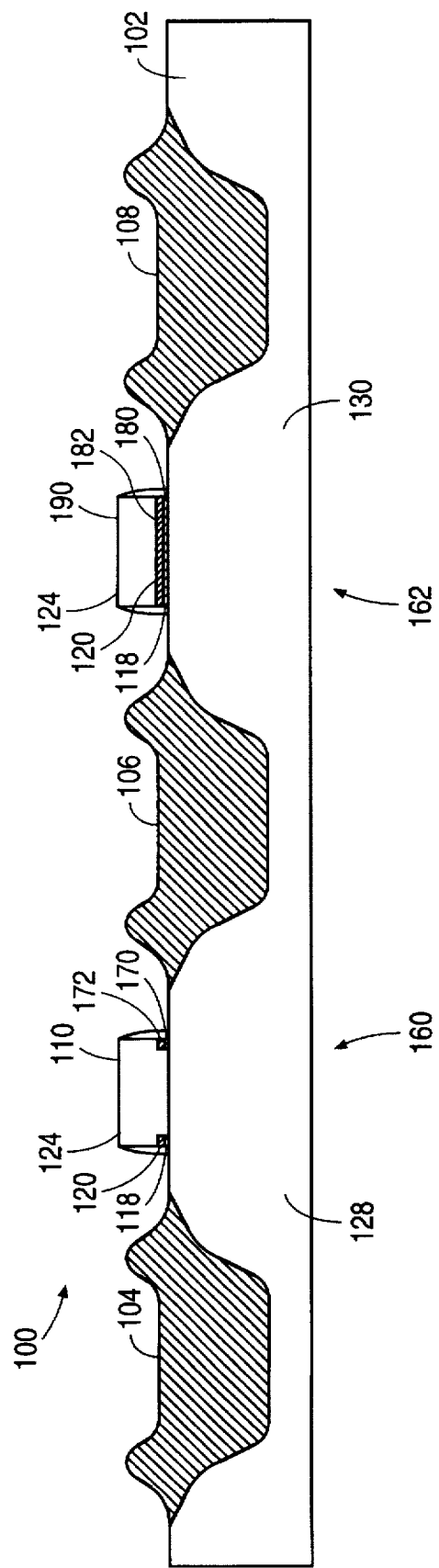
FIG. 1 illustrates a sectional view of a conventional single polysilicon BiCMOS integrated circuit which is fabricated using a first conventional BiCMOS technology manufacturing method.
Figure 2:
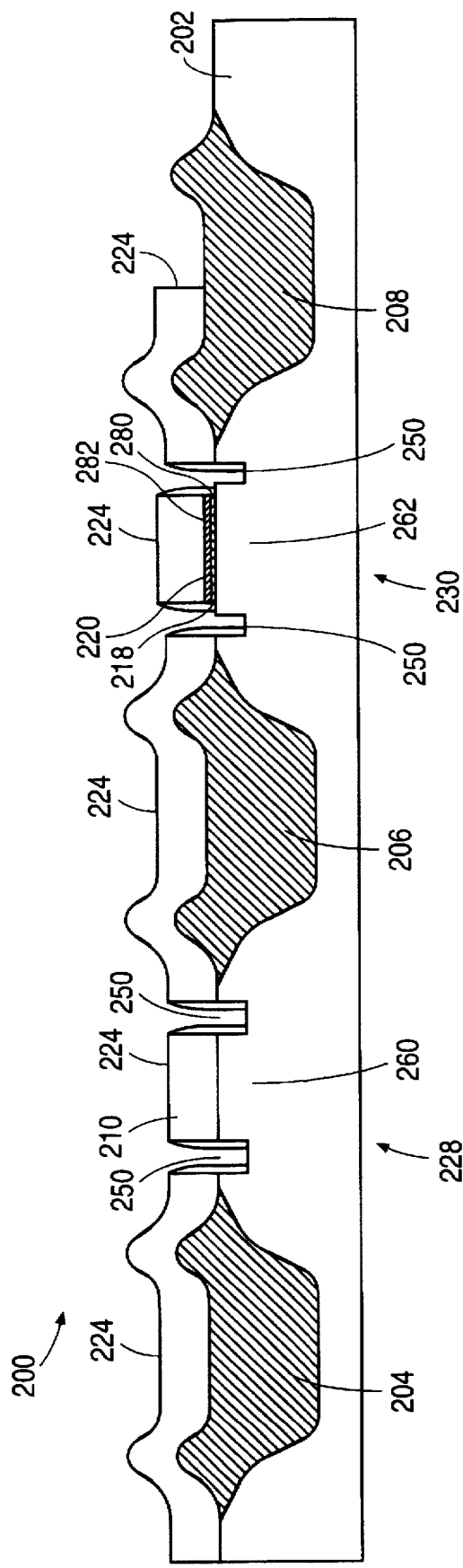
FIG. 2 depicts a sectional view of a conventional single polysilicon BiCMOS integrated circuit which is fabricated using a second conventional BiCMOS technology manufacturing method with polysilicon contacting silicon to furnish a source/drain of a MOS transistor.
Figure 3:
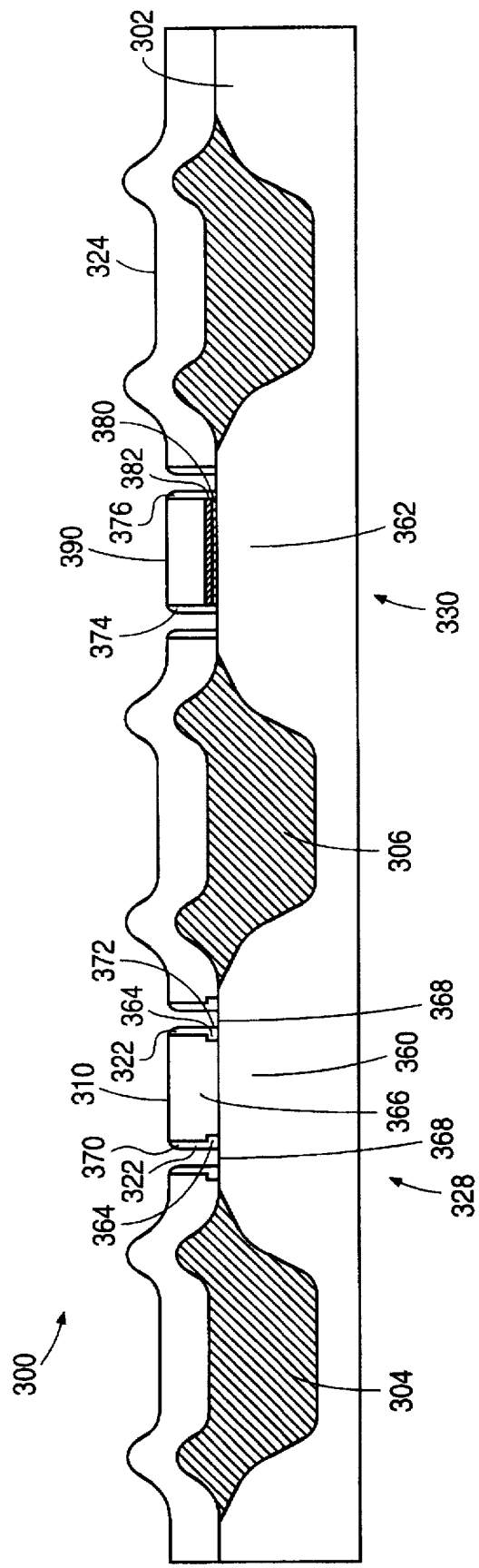
FIG. 3 illustrates a sectional view of a polysilicon BiCMOS integrated circuit which is fabricated using an illustrative improved BiCMOS technology manufacturing method.

FIG. 3 depicts a sectional view of an illustrative embodiment of an improved BiCMOS integrated circuit which is fabricated using an improved BiCMOS circuit fabrication method. A BiCMOS integrated circuit 300 includes a silicon wafer substrate 302 having a bipolar region 328 onto which a bipolar transistor 360 is fabricated and a MOS region 330 onto which a CMOS transistor 362 is fabricated. Regions, such as bipolar region 328 and CMOS region 330, are separated by regions of field oxide 304, 306 and 308.

Bipolar transistor 360 includes a polysilicon emitter 310 adjacently overlying substrate 302 in bipolar region 328. Polysilicon emitter 310 is etched from a thick polysilicon film 324 so that the emitter 310 lateral walls 322 are substantially perpendicular with respect to the surface of integrated circuit 300 and substrate 302. Polysilicon emitter 310 has a thickness in the range from 0.1μ to 0.4μ. The lateral breadth of polysilicon emitter 310 ranges from approximately 0.8μ to 2.5μ. At a foot surface 368 of polysilicon emitter 310, which bounds substrate 302 in bipolar region 328, lateral notches 364 in polysilicon emitter 312 extend along the surface of substrate 302 from the lateral edges of polysilicon emitter 310 toward the medial portion 366 of the foot surface 362 to a depth of approximately 0.1μ to about 0.4μ. Advantageous shallower depths are expected with improvements in fabrication technology. A thin layer of polysilicon fills lateral notches 364 and forms lateral polysilicon emitter sidewalls 370 and 372. The polysilicon-filled notches 364 and polysilicon sidewalls 370 and 372 extend electrical activity of emitter 310 to the lateral edges of emitter 310. Note that failure to fill the notches would result in an insulating region at the edges of the emitter structure, thereby disadvantageously increasing base resistance $R_b$ of bipolar transistor 360 without gaining the emitter active area without contributing gain to the active region of the transistor 360.

CMOS transistor 362 includes a polysilicon gate 390 adjacently overlying substrate 302 in CMOS region 330. Polysilicon gate 390 is etched from the polysilicon film 324 so that the gate 390 lateral walls are substantially perpendicular with respect to the surface of integrated circuit 300 and substrate 302. In the illustrative embodiment, polysilicon gate 390 has a thickness that is equal to the thickness of polysilicon emitter 310 and thin polysilicon layer 382, a combined thickness in the range from 0.1μ to 0.5μ. The lateral breadth of polysilicon gate 390 ranges from 0.8μ to 2.5μ. Polysilicon gate 390 is separated from substrate 302 in CMOS region 330 by CMOS gate oxide layer 380, which directly overlies substrate 302 and a CMOS thin polysilicon layer 382. A thin layer of polysilicon forms lateral polysilicon gate sidewalls 374 and 376.

Figure 4A:
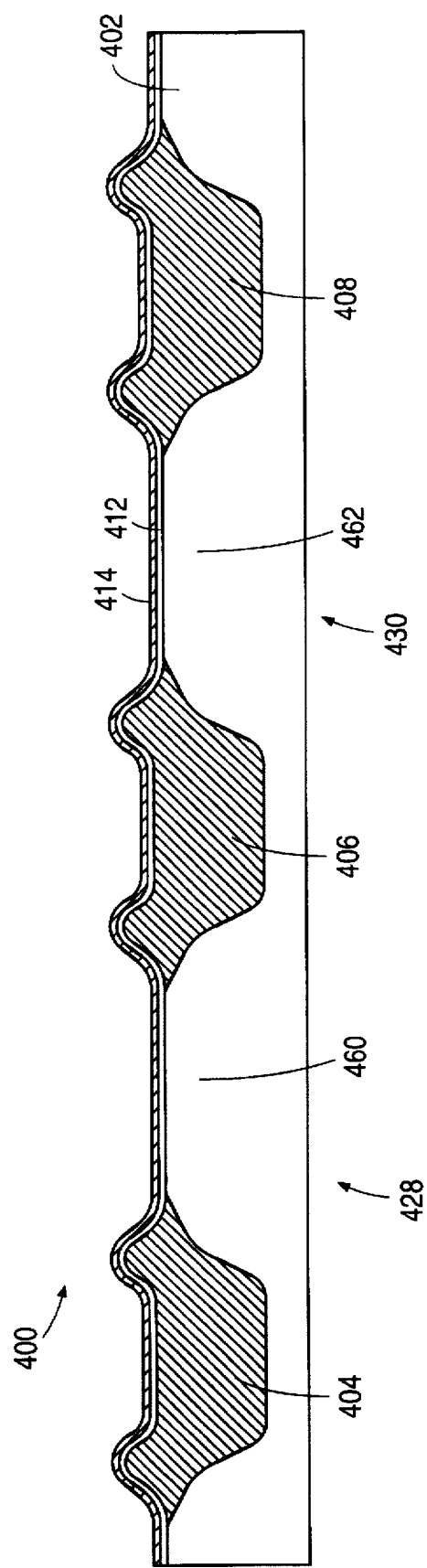
FIGS. 4(a)–4(i) are process sectional views illustrating a method of manufacturing a bipolar transistor in a single polysilicon BiCMOS technology.

FIGS. 4(a)–4(i) are process sectional views illustrating a method of manufacturing a bipolar transistor as in FIG. 3 in a polysilicon BiCMOS technology. FIG. 4(a) depicts a process integrated circuit 400 including a silicon wafer substrate 402 and regions of field oxide 404, 406 and 408, which are manufactured using conventional BiCMOS methods. A bipolar region 428 and a MOS region 430 are shown in the silicon wafer substrate 402.

For example, a p-type or n-type silicon wafer substrate 402 may be processed to form various passive devices and active devices, including n-channel and p-channel CMOS transistors and bipolar transistors. Devices are formed by forming a "well" of opposite polarity of the device to be formed. In this exemplary BiCMOS process, $n^+$ antimony implant layers may be buried into a p-type substrate wherever an npn bipolar transistor or PMOS device is to be formed. Similarly, p-type boron impurities may be implanted to form a $p^+$ well wherever an NMOS device is to be formed. Approximately a one micron layer of n-type epitaxial growth is grown to form collectors of npn bipolar devices and bulk regions of PMOS devices.

Field oxide regions 404, 406 and 408 are formed by masking to define regions for thick oxide growth. A layer of silicon nitride is deposited and patterned with a mask, leaving silicon nitride only in regions where active devices are to be placed. These regions are then etched down into the epitaxial layer. Field oxide growth is performed by local oxidation to isolate active devices from one another. In the process shown in FIGS. 4(a)–4(i), the field oxide regions are not planarized. In other embodiments, these regions may be planarized by etching back field oxide that has grown above the plane of the surface to the level of other regions. The silicon nitride mask that is deposited to pattern the active regions is removed from the active device areas prior to the process shown in FIG. 4(a).

Then in an oxidation step, a thin layer of silicon dioxide (SiO$_2$) 412 is grown, or oxidized, onto the substrate 402 and the field oxide regions 404, 406 and 408 of process integrated circuit 400. The thin oxide layer is formed to a thickness of approximately 100 Å to 200 Å. A nitride deposition step deposits a thin layer of silicon nitride (SiN) 414 on the surface of the thin dioxide layer. The thin nitride layer is formed to a thickness of approximately 200 Å to 400 Å. The substrate shown in FIG. 4(a) is in a condition for performing masking steps and p- and n-type implants to form bipolar transistor base and emitter regions, low-resistance bipolar collector contacts and source and drain regions for the MOSFETS.

Bipolar transistors are formed in bipolar region 428 by depositing an emitter structure on the surface of thin nitride layer 414 overlying thin oxide layer 412. However, only the edges of the emitter structure are deposited overlying the thin nitride layer 414. The thin nitride and oxide layers are removed from the surface of process integrated circuit 400 from all regions other than those regions, such as bipolar region 428, at which the emitter structure of a bipolar transistor is to be positioned. Furthermore, the thin nitride and oxide layers are removed from the region under the central strip of the emitter. For example, the emitter structure 310 of FIG. 3 having a width of 1μ may be positioned over thin oxide and nitride layers under each of the two edges of the emitter structure, each of which extend roughly 0.1μ to 0.4μ under the emitter. The oxide and nitride layers extend roughly 0.1μ to 0.4μ beyond the edges of the emitter structure.

Figure 4B:
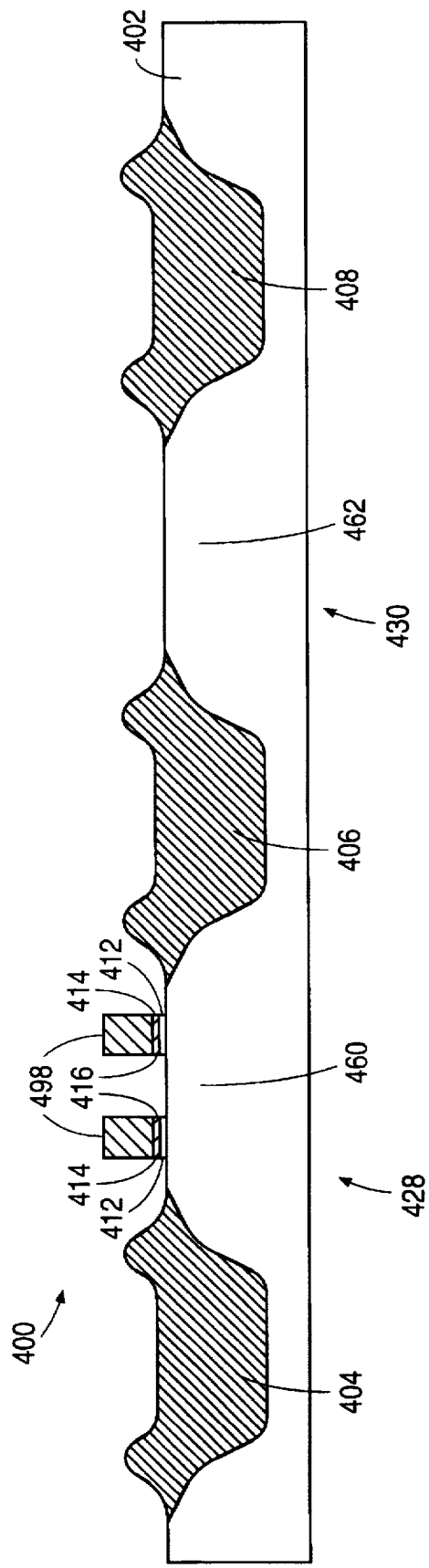

FIG. 4(b) illustrates a masking operation for protecting thin oxide layer 412 and thin nitride layer 414 that underlie the edges of a bipolar transistor emitter. A layer of photoresist 498 is deposited on the process integrated circuit 400 and exposed through a mask that defines the emitter edges and developed. The thin nitride and oxide patterns are subsequently etched normally. The oxide is etched by a wet etch operation, using liquids such as hydrogen fluoride (HF) or buffered oxide etchant. The wet etch operation alternatively employs acids or other corrosive chemicals to chemically erode selected portions of a surface to produce a predetermined pattern of photoresist 498, thin nitride layer 414 and thin oxide layer 412 on the surface. Usage of a wet etch operation protects against etching of silicon. The remaining photoresist is removed by a chemical stripping operation, leaving patterned emitter footings 416 of thin nitride 414 and oxide 412 layers at locations in bipolar region 428 at which bipolar emitters are to be formed.

Ion implantation processes may be applied to the substrate 402 at MOS region 430 at this point to adjust surface concentrations in what becomes the channel of the MOS transistors. Additional processing operations include application of threshold-adjusting implants to the MOS devices.

Figure 4C:
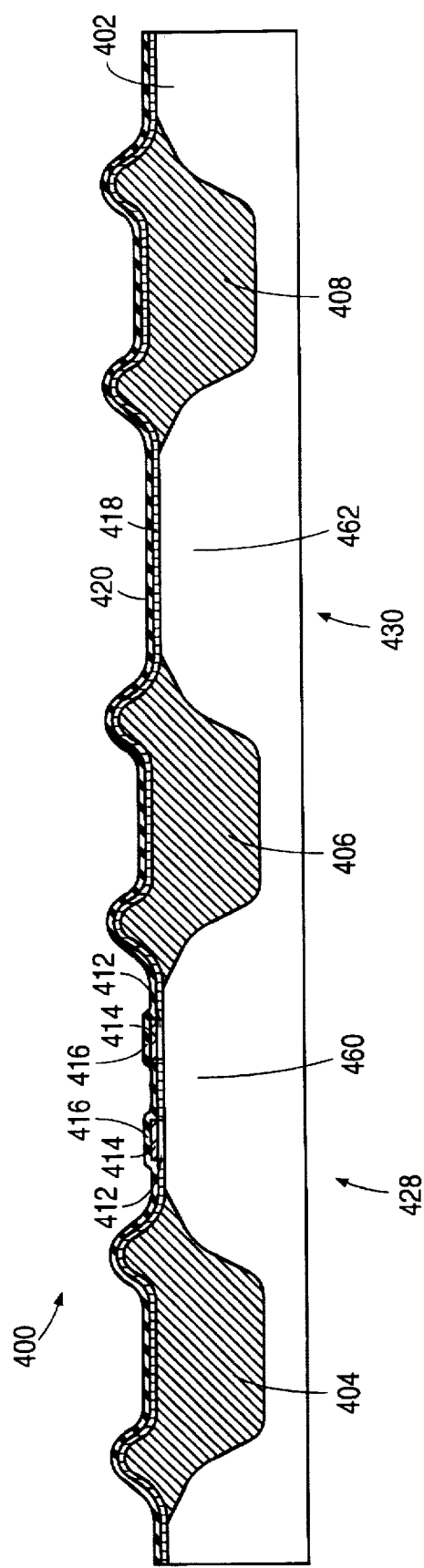

MOS devices of the BiCMOS process integrated circuit 400 are developed on substrate regions in MOS region 430 that are overlaid by a layer of gate oxide and polysilicon. FIG. 4(c) shows steps of gate oxidation and thin polysilicon deposition, leaving a thin layer of gate oxide 418 and a thin layer of polysilicon 420 over the integrated circuit 400 surface. Thus, the thin layer of gate oxide 418 covers regions of substrate 402, regions of field oxide 404, 406 and 408, and the patterned emitter footings 416, which include thin nitride 414 and oxide 412 layers. A masking step removes the gate oxide 418 and polysilicon 420 layers from the surface of the process integrated circuit 400 in all regions other than those regions, such as MOS region 430, at which MOS devices are constructed. Gate oxide layer 418 and polysilicon layer 420 are formed to assist fabrication of CMOS transistors in the MOS region 430. Subsequently, MOS region 430 is protected by a mask and the surface of process integrated circuit 400 is etched. Thus the gate oxide 418 and thin polysilicon 420 layers are protected in the MOS region 430 but removed from the bipolar region 428. The thin nitride layer 414 that overlies the thin oxide layer 412 in the bipolar region 428 is deposited for the purpose of protecting thin oxide layer 412 during removal of the gate oxide 418 and thin polysilicon 420 layers.

Figure 4D:
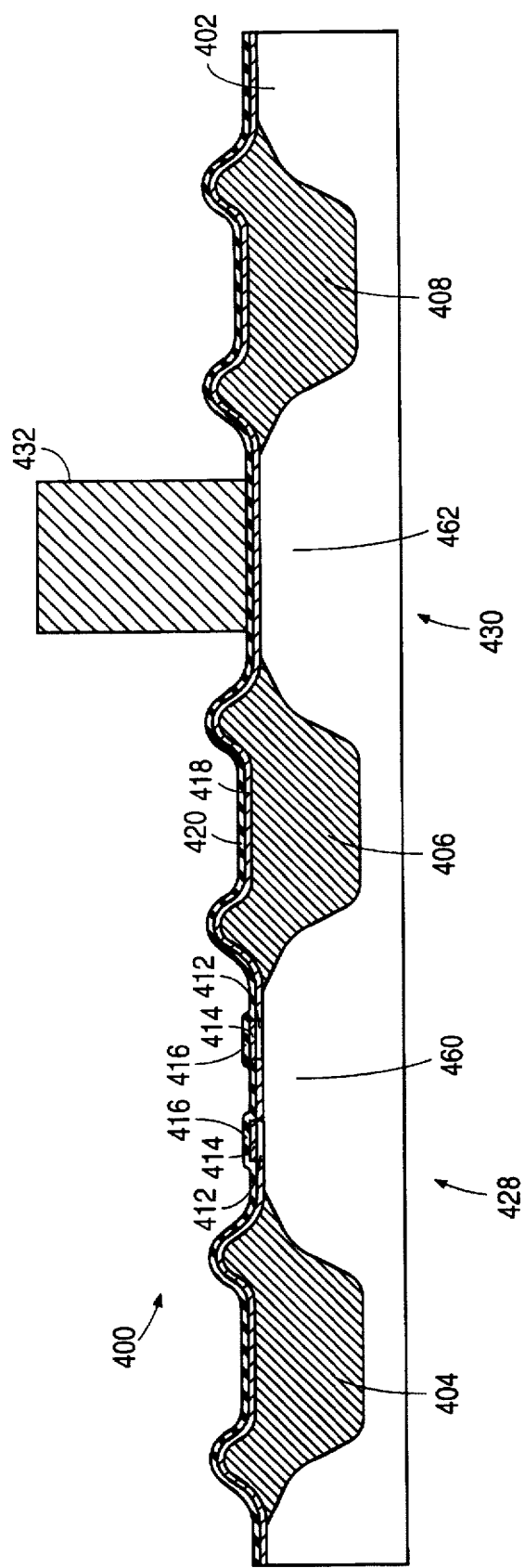

FIG. 4(d) illustrates the step of photoresist definition for protecting gate oxide layer 418 and polysilicon layer 420 at the location of MOS devices 430. A layer of photoresist is deposited on the process integrated circuit 400 and exposed through a mask that defines the MOS devices, and developed. The process integrated circuit 400 is etched, leaving structures including the predetermined pattern of photoresist 432, polysilicon layer 420 and gate oxide layer 418 defining MOS device structure locations, and thin nitride layer 414 and thin oxide layer 412 remaining from bipolar device processing. The thin polysilicon and gate oxide patterns are etched in a conventional manner. The emitter openings for the npn transistors are processed with normal precautions of conventional polysilicon emitter npn technology, including a step of cleaning the surface of the process integrated circuit 400 before polysilicon deposition. The etching process includes a first etching step to etch the thin polysilicon in a dry etch process in which reactive plasmas carry out etching in a gas phase and a second etching step to etch the gate oxide in a wet etch process.

Figure 4E:
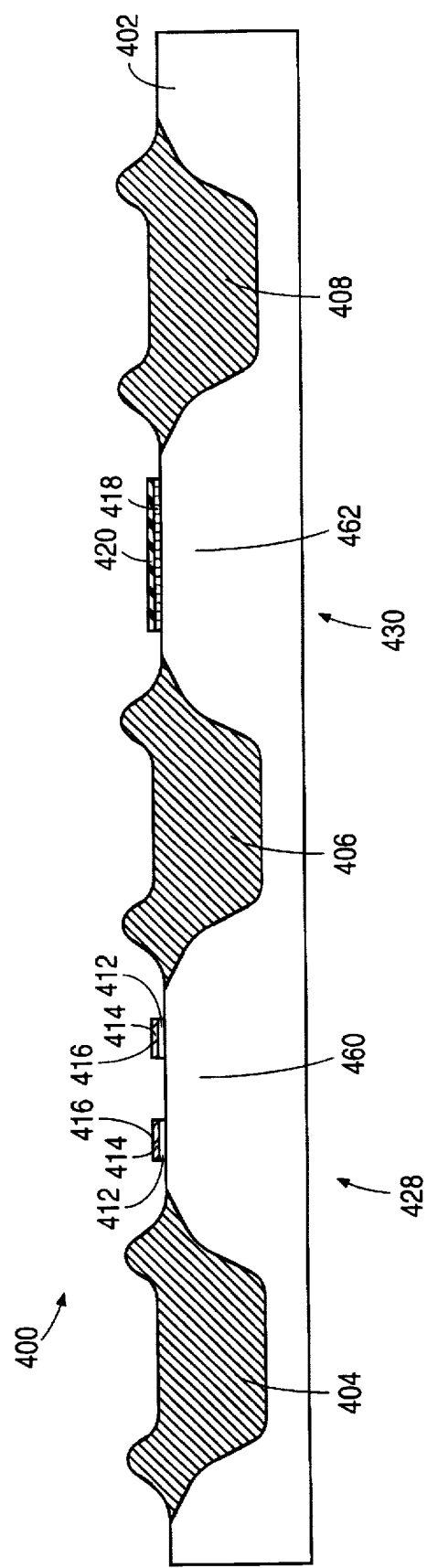

Referring to FIG. 4(e), the remaining photoresist is removed by a chemical stripping operation, leaving patterned emitter footings 416 of thin nitride 414 and oxide 412 layers at locations in bipolar region 428 at which bipolar emitters are to be formed and patterned gate oxide 418 and thin polysilicon 420 layers at locations in MOS region 430 at which MOS devices are to be formed.

Figure 4F:
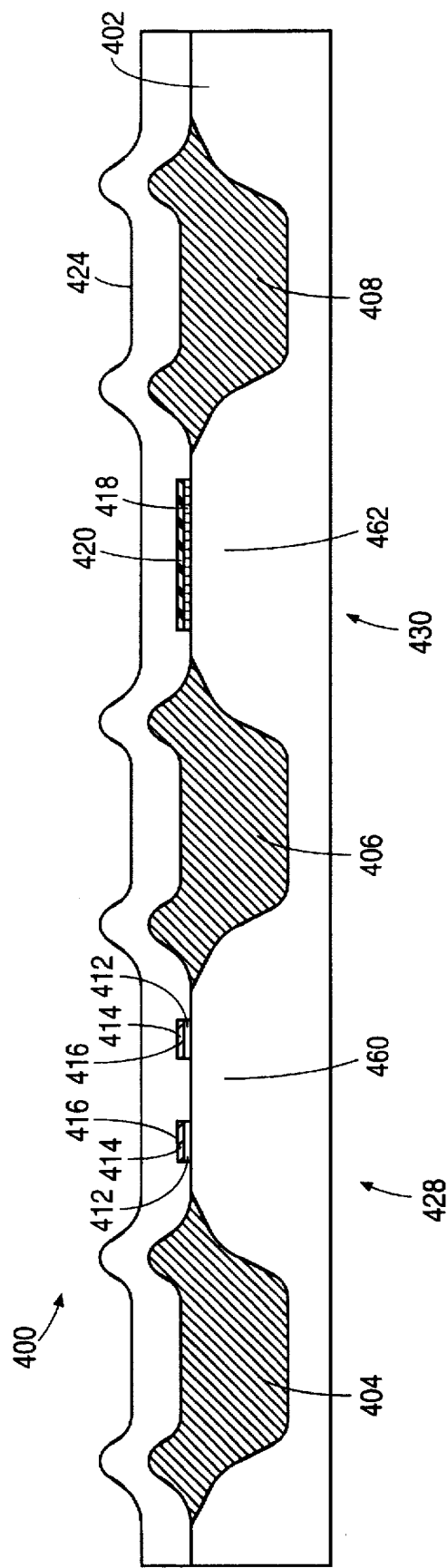

Referring to FIG. 4(f), a thick layer of polysilicon 424 is deposited on the process integrated circuit 400. Bipolar transistor emitters are to be formed in the thick polysilicon layer 424. Thick polysilicon layer 424 is deposited to a thickness of approximately 0.1μ to 0.5μ.

Various structures of various devices are defined with a polysilicon masking and etching operation. The thick polysilicon is masked and etched to pattern the emitter, base and collector polysilicon of a bipolar transistor in the bipolar region 428 and to pattern the source/drain and gate polysilicon for a MOS transistor in the MOS region 430. For MOS transistors in MOS region 430, the polysilicon is over-etched, with etch endpoints on the gate oxide 418 for the entire width of these layers. As etching proceeds beyond the width of the gate oxide 418 and thin polysilicon layer 420, thick polysilicon layer 424 is etched to the level of substrate 402 and beyond, into the substrate 402. For bipolar transistors, thick polysilicon layer 424 is etched in bipolar region 428 to an endpoint on the thin nitride layer 414. The thin silicon nitride layer 414 and thin oxide layer 412, which constitute the emitter footings 416, are made as thin as possible and define the endpoint for etching the emitter. Thus, etching of the emitter is precisely controlled.

In a MOS masking operation, MOS devices are covered with photoresist and process integrated circuit 400 is etched to remove oxide from the source and drain areas. Using either diffusion or ion implantation, arsenic or phosphorous are implanted into the substrate in a MOS region 430. After a short oxidation step, a masking operation is repeated for n-channel devices, in which boron is implanted. The photoresist from this processing is chemically stripped using a stripping agent such as sulfuric acid ($H_2SO_4$).

Figure 4G:
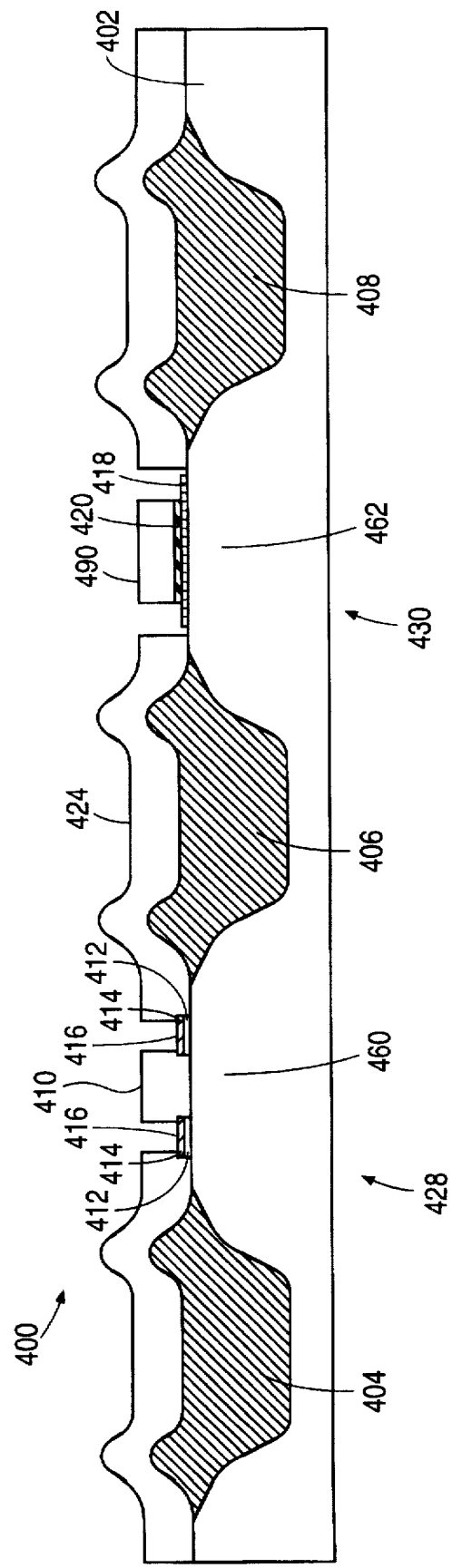

At this stage of the process, following a polysilicon definition mask and etch step illustrated in FIG. 4(g), a bipolar transistor in bipolar region 428 includes a substrate region 402, patterned emitter footings 416 of thin nitride 414 and oxide 412 layers at locations in bipolar region 428 at which bipolar emitters are to be formed, and an etched thick polysilicon layer 424 forms an emitter 410. A CMOS transistor in MOS region 430 includes a substrate region 402, patterned gate oxide 418 and thin polysilicon 420 layers at locations in MOS region 430 at which MOS devices are to be formed and an etched thick polysilicon layer 424 forms a polysilicon gate 490. In the MOS region 430, this etching process patterns the CMOS source/drain and gate and selectively over-etches thick polysilicon film layer 424 and thin polysilicon film, layer 420 to an endpoint in the gate oxide 418. Thick polysilicon 424 covers the field oxide regions 404, 406 and 408, as well as other substrate regions 402 that are not removed by etching. Of the area that is etched in the polysilicon definition mask and etch step illustrated in FIG. 4(g), substantially the entire silicon substrate is protected. Note that if polysilicon is used for source/drain contacts, a small portion of the source/drain area is not protected and is over-etched. A trench that results from this over-etching is small and does not affect operating capabilities of the transistor. The trench is refilled in a subsequent polysilicon deposition step. If polysilicon is not used for source/drain contacts, essentially the entire silicon substrate is protected.

Bipolar transistor substrate is protected by silicon nitride 414 and silicon dioxide 412 layers. MOS transistor substrate is protected by gate oxide layer 418. Therefore, the polysilicon etch process is a precisely controlled over-etch process, in which the etching endpoint, both for bipolar and MOS transistors is controlled to an accuracy determined by the selectivity of the polysilicon etch process to silicon nitride and silicon dioxide etching and also determined by the thickness of the thin nitride 414 and thin oxide 412. The precise control of over-etching makes possible a semiconductor wafer which varies in etching depth by 100Å or less across the semiconductor wafer. This is a substantial improvement in depth uniformity in comparison to conventional BiCMOS processes which employ trenching techniques. For these conventional processes, a common specification of depth variability allows depths to vary from 1000Å to 2000Å. Even though these large variabilities are allowed, the standard is difficult to achieve using conventional fabrication processes.

Figure 4H:
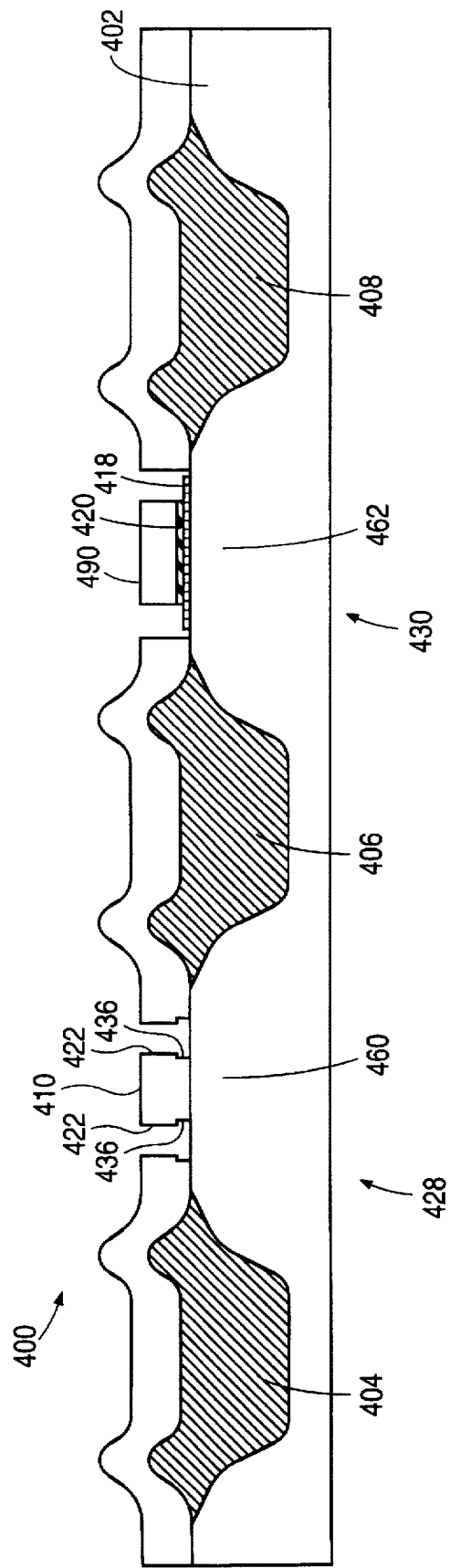

Next, patterned emitter footings 416 of thin nitride 414 and oxide 412 layers at locations in bipolar region 428 are removed, resulting in the structure shown in FIG. 4(h). Thin nitride layer 414 is chemically stripped using a stripping agent such as phosphoric acid ($H_3PO_4$). Subsequently, the MOS transistor is masked with photoresist at the location of MOS devices 430 to protect gate oxide layer 418. A wet etch process (HF) is applied to remove the thin oxide layer 412 from under the emitter 410 in the bipolar region 428 of the process integrated circuit 400. Etching the thick polysilicon layer 424 in this manner selectively etches the polysilicon film to an endpoint substantially at the silicon dioxide layer 412 and essentially avoids trenching of the silicon substrate 402.

Following the emitter etch processing, the central strip of emitter 410 directly abuts substrate 402 in bipolar region 428, however, the emitter 410 is separated from other portions of the etched thick polysilicon layer 424. Lateral sides 422 of emitter 410 are essentially perpendicular to emitter 410 top and bottom surfaces and the bottom edges of the emitter 410 are notched leaving notches 436 in the integrated circuit 400 structure.

Figure 4I:
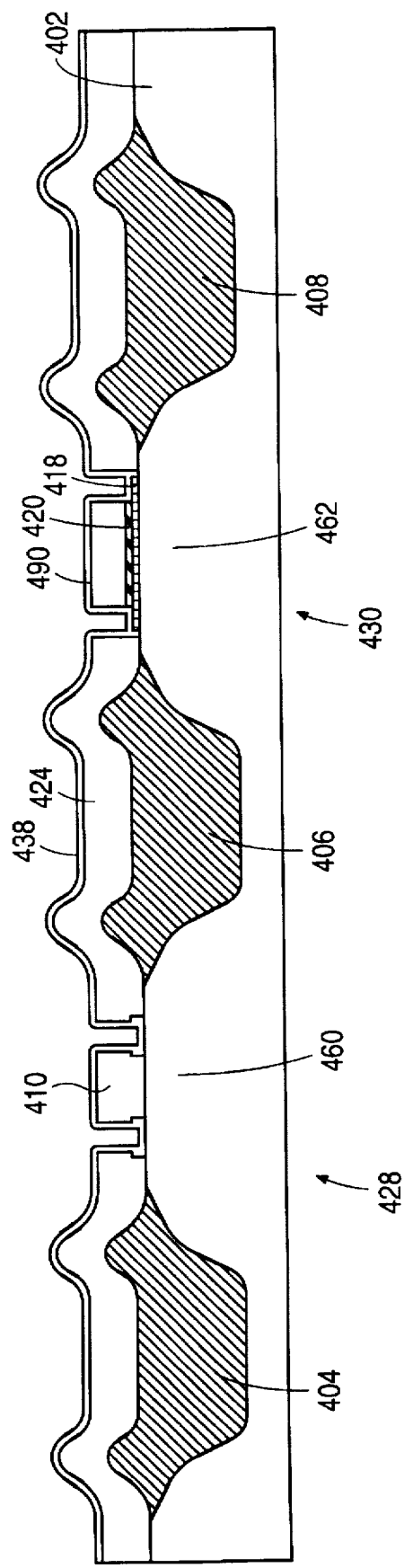

The photoresist protecting the MOS transistor is chemically stripped, for example using $H_2SO_4$. A conventional cleaning operation is applied to the process integrated circuit 400 in the manner of the cleaning performed prior to the emitter polysilicon deposition process. Referring to FIG. 4(i), a thin polysilicon layer 438 is then deposited as thinly as is possible, less than approximately 500 Å, using a low pressure chemical vapor deposition (LPVCD) process. Thin polysilicon layer 438 covers the process integrated circuit 400 adjacent to thick polysilicon layer 424. In the bipolar region 428, thin polysilicon layer 438 encases emitter 410 and substrate 402 in the locations where thick polysilicon layer 424 is removed. Thus, thin polysilicon layer 438 fills notches 436. In MOS region 430, thin polysilicon layer 438 encases polysilicon gate 490 and polysilicon layer 420 overlying oxide gate layer 418. In locations of MOS region 430 that are over-etched into substrate 402, thin polysilicon layer 438 abuts substrate 402.

At this point, the thin polysilicon deposition is completed and a thin polysilicon etchback step is applied to remove remaining polysilicon in areas such as MOS region 430 source/drain and extrinsic base, resulting in the structure of the process integrated circuit 300 shown in FIG. 3. The etchback step is preferably a anisotropic etch with a precisely controlled amount of over-etch. Due to the thinness of the etched polysilicon layer, this over-etch is very small compared with the over-etch that is commonly done to etch the emitter polysilicon. Processing returns to conventional BiCMOS process flow paths including ion implantations and lightly doped drain (LDD) implants. Emitter 410 has full contact to silicon by way of the second polysilicon layer that filled the gap left by the gate oxide on the very minimal trench created. Source/drain contacts are made with polysilicon and metal contacts are made to the polysilicon contacts in a conventional manner to predetermined regions. The chip is coated with deposited silicon dioxide ($SiO_2$). A second layer of metal interconnects are formed on top of this oxide with vias making connection to elements below. A further deposited layer of $SiO_2$ is then added with a third layer of metal interconnect and vias to give even more flexibility and thus to improve the density of the layout. A silicon dioxide deposition on the wafer using chemical vapor deposition deposits a layer that reduces parasitic capacitances of the interconnect metallization. Contact windows are formed and defined and metallization is defined using a masking operation.

Figure 5A:
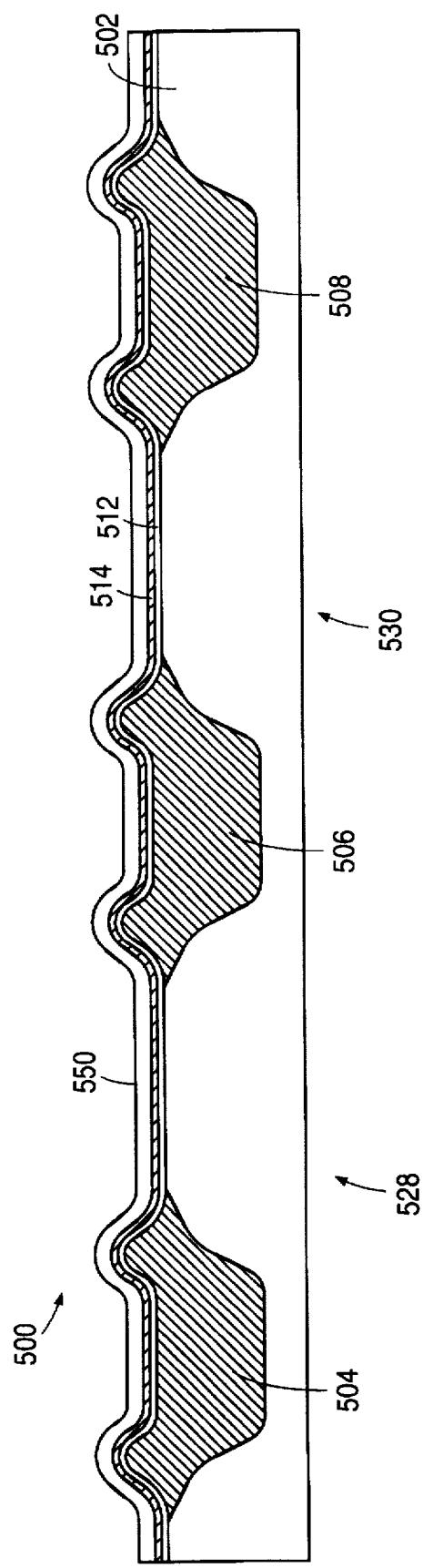
FIGS. 5(a)–5(c) are process sectional views illustrating supplemental steps of an additional embodiment of a method of manufacturing a bipolar transistor in a single polysilicon BiCMOS technology.
Figure 5B:
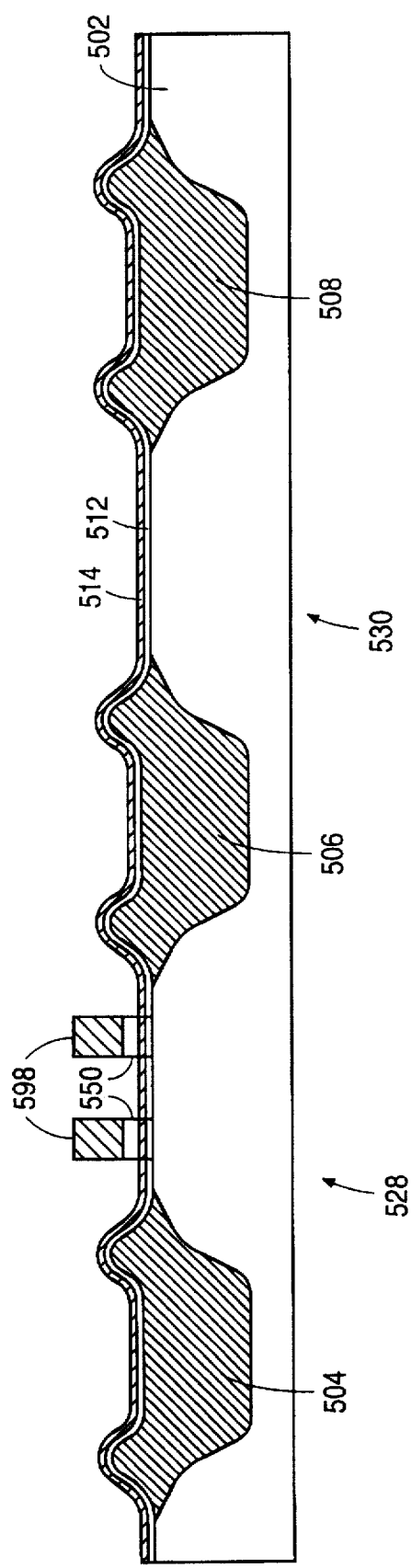
Figure 5C:
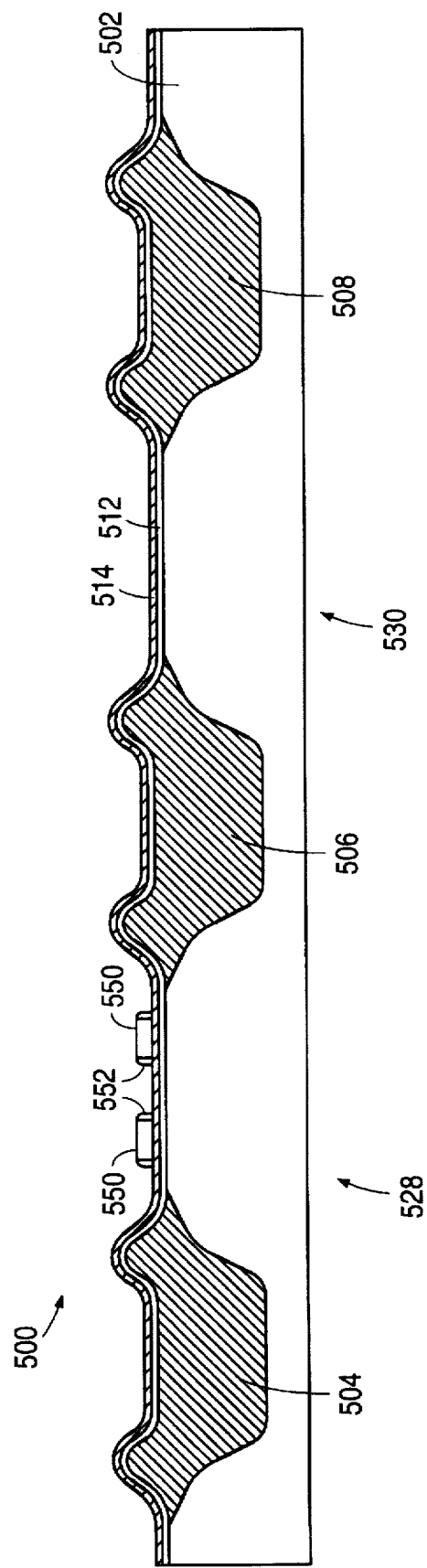

FIGS. 5(a)–5(c) are process sectional views illustrating supplemental steps of an additional embodiment of a method of manufacturing a bipolar transistor in a single polysilicon BiCMOS technology. The supplemental steps supplement the steps depicted in FIGS. 4(a)–4(i). The additional embodiment furnishes a method for BiCMOS processing which advantageously reduces the size of the bipolar transistor structures. FIG. 5(a) depicts a process integrated circuit 500 including a silicon wafer substrate 502 and regions of field oxide 504, 506 and 508, which are manufactured using conventional BiCMOS methods, such as methods utilized in the method embodiment shown in FIGS. 4(a) through 4(i). A bipolar region 528 and a MOS region 530 are shown in the silicon wafer substrate 502.

In an oxidation step, a thin layer of silicon dioxide (SiO$_2$) 512 is oxidized onto the substrate region 502 and the field oxide regions 504, 506 and 508 of process integrated circuit 500. The thin oxide layer is formed to a thickness of approximately 100 Å to 200 Å. A nitride deposition step deposits a thin layer of silicon nitride (SiN) 514 on the surface of the silicon dioxide layer. The thin nitride layer 514 is formed to a thickness of approximately 200 Å to 6000 Å that is sufficient to leave some remaining nitride after subsequent oxide etching. Deposition of oxide 512 and nitride 514 layers in FIG. 5(a) is substantially the same as deposition of oxide 412 and nitride 414 layers in the embodiment shown in FIG. 4(a). In addition, a layer of oxide 550 of a thickness from approximately 1000 Å to 3000 Å is deposited onto the nitride layer 514.

FIG. 5(b) illustrates a masking operation for protecting thin oxide layer 512, thin nitride layer 514 and CVD oxide layer 550 that underlie the edges of a bipolar transistor emitter. A layer of photoresist 598 is deposited on the process integrated circuit 500 and exposed through a mask that defines the emitter edges. The photoresist 598 is developed and CVD oxide 550 patterns are subsequently etched normally to endpoint on the thin nitride layer 514. CVD oxide 550 is etched by a dry oxide etch process and photoresist 598 is removed by chemical stripping.

Referring to FIG. 5(c), a spacer material layer 552 is deposited and etched back so that it is removed from all regions other than the locations covering what remains of CVD oxide 550 after this anisotropic etchback. Thin nitride layer 514 and oxide layer 512 are also etched during etch-back of the spacer material 552. In this manner, spacer material layer 552 is applied to the medial and lateral sides of the footings 416 of FIGS. 4. The medial spacers serve to reduce the width of emitter 410, which is subsequently formed in the polysilicon deposition step illustrated in FIG. 4(f) and the etching step shown in FIG. 4(g). This reduced width is smaller than the dimension that is attainable using lithographic techniques alone. After spacer etch-back removes thin nitride 514 from the opening of emitter 510 an isotropic oxide etch step is performed to remove thin oxide layer 512, CVD oxide layer 550 and spacer material layer 552.

Remaining processing steps of this second embodiment of the BiCMOS processing method are the steps illustrated in FIGS. 4(c) through 4(i). The second embodiment furnishes a method for BiCMOS processing which advantageously reduces the size of bipolar transistor structures. In the method depicted in FIGS. 4(a) through 4(i), the active opening of emitter 410 has a minimum dimension that is determined by the accuracy of integrated circuit lithographic capabilities. This minimum dimension is increased by two widths of the overlay capability of a lithographic system stepper, where the overlay capability is the accuracy of a stepper when attempting to place one layer on top of another. Overlay accuracies of approximately 0.15µ are currently available. For supplemental method shown in FIGS. 5(a) through 5(c), the active opening is reduced by two spacer widths, a reduction of approximately 0.3 to 0.4µ.

Various other embodiments and modifications and improvements not described herein may be within the spirit and scope of the present invention. For example in an alternative embodiment, thin nitride layer 514 or 414 may be replaced with a thin polysilicon layer having a thickness range from approximately 300 Å to 600 Å. In this embodiment, because thin nitride layer 514 or 414 is replaced, chemical stripping of the nitride layer using a stripping agent such as phosphoric acid (H$_3$PO$_4$) is no longer performed. The thin oxide layer thickness is increased to approximately 1000 Å so that the depth of the notches 436 at the bottom edges of the emitter 410 is sufficient to permit polysilicon to be deposited into the notches 436 when thin polysilicon layer 438 is deposited.

The embodiments described above are illustrative only and are not limiting. The scope of the present invention is limited only by the claims which follow.

I claim:

1. A method of fabricating on a silicon substrate an emitter of a bipolar transistor in a BiCMOS integrated circuit comprising the steps of:

forming footings on the silicon substrate for prospectively supporting lateral edges of the emitter while leaving a medial portion of the emitter adjacent to the silicon substrate;

forming a polysilicon emitter in a pattern having the medial portion overlying the silicon substrate and having the lateral edges supported by the footings;

removing the footings by an etch that is preferential to the footings as compared to polysilicon emitter leaving notches at the lateral edges of the polysilicon emitter; and refilling the notches with a thin polysilicon film.

2. A method as in claim 1 wherein the step of forming footings further includes the steps of:

forming an oxide layer on the silicon substrate;

forming a silicon nitride layer on the oxide layer; and patterning and etching the silicon nitride layer and the oxide layer.

3. A method of fabricating an emitter of a bipolar transistor in a BiCMOS integrated circuit comprising the steps of:

forming a silicon dioxide layer over a surface of a silicon substrate;

depositing an oxide protecting layer overlying the silicon dioxide layer;

patterning the silicon dioxide and oxide protecting layers to furnish footings for prospectively supporting lateral edges of the emitter while leaving a medial portion of the emitter in contact with the silicon substrate;

depositing a first layer of polysilicon film overlying the surface of the silicon substrate and the footings;

patterning the first layer of polysilicon film to form the emitter by selectively etching the polysilicon film so that a bottom surface of the first layer of polysilicon film has a medial opening abutting the surface of the silicon substrate and lateral edges abutting the silicon dioxide layer and oxide protecting layer footings;

removing the footings, leaving lateral notches at the bottom of the first layer of polysilicon film;

depositing a second layer of polysilicon film overlying the surface of the first polysilicon film layer and the emitter and filling the emitter lateral notches; and etching back the second layer of polysilicon film, leaving the second layer of polysilicon film as emitter sidewalls and filling the notches of the first layer of polysilicon film.

4. A method as in claim 3, wherein the oxide protecting layer is a deposition of silicon nitride.

5. A method as in claim 4, wherein the step of removing the footings includes the steps of stripping the silicon nitride oxide protecting layer and etching the silicon dioxide layer.

6. A method as in claim 4, wherein the step of patterning the silicon dioxide and oxide protecting layers includes the steps of:

applying a photoresist layer over the silicon dioxide and silicon nitride layers;

selectively exposing the photoresist layer;

stripping the silicon nitride; and wet etching the silicon dioxide.

7. A method as in claim 3, wherein the oxide protecting layer is a deposition of polysilicon.

8. A method as in claim 7, wherein the step of patterning the silicon dioxide and oxide protecting layers includes the steps of:

applying a photoresist layer over the silicon dioxide and polysilicon layers;

selectively exposing the photoresist layer; and wet etching the silicon dioxide.

9. A method as in claim 3, wherein the silicon dioxide layer is formed with a thickness of approximately 100 Å to 200 Å.

10. A method as in claim 3, wherein the oxide protecting layer is deposited with a thickness of approximately 200 Å to 400 Å.

11. A method as in claim 3, wherein the polysilicon layer is deposited with a thickness of approximately 0.1µ to 0.5µ.

12. A method as in claim 3, wherein the step of patterning the first layer of polysilicon film includes forming a bipolar transistor base electrode and collector electrode and a CMOS source/drain opening and gate electrode.

13. A method as in claim 12, wherein the step of patterning the first layer of polysilicon film for forming the bipolar transistor base and collector and CMOS source/drain and gate selectively over-etches the polysilicon film to an endpoint in the silicon substrate.

14. A method as in claim 12, wherein the step of patterning the first layer of polysilicon film for forming the emitter selectively etches the polysilicon film to an endpoint substantially at the silicon dioxide layer.

15. A method as in claim 3, wherein the step of removing the footings includes wet etching the silicon dioxide layer.

16. A method as in claim 3, wherein the second layer of polysilicon film is deposited by low pressure chemical vapor deposition (LPCVD) having a thickness of less than approximately 500 Å.

17. A method as in claim 3, further comprising steps subsequent to the silicon nitride layer depositing step and precedent to the silicon dioxide and silicon nitride layer patterning step, including the steps of:

depositing a chemical vapor disposition (CVD) oxide layer overlying the silicon nitride layer;

patterning the CVD oxide layer to furnish footings for prospectively bearing edges of the emitter, retaining the silicon dioxide and silicon nitride layers;

depositing a spacer material layer overlying the CVD oxide layer and the silicon nitride layer; and etching back the spacer material layer, leaving the spacer material layer as CVD oxide sidewalls.

18. A method as in claim 17, wherein the step of patterning the CVD oxide layer includes the step of etching the CVD oxide layer by dry etch.

19. A method as in claim 18, wherein the spacer material constitutes an oxide.

20. A method as in claim 18, wherein the spacer material constitutes a polysilicon.

21. A method of fabricating a BiCMOS integrated circuit comprising the steps of:

forming a plurality of field oxide regions in a silicon substrate for separating a plurality of bipolar and CMOS transistor elements;

forming a silicon dioxide layer overlying the surface of the silicon substrate and the field oxide regions;

depositing an oxide protecting layer overlying the silicon dioxide layer;

patterning the silicon dioxide layer and the oxide protecting layer to furnish bipolar transistor footings for prospectively bearing edges of the bipolar transistor emitter, removing the silicon dioxide layer and oxide protecting layer from the silicon substrate and field oxide film surfaces in locations other than bipolar footing locations;

forming a gate oxide layer overlying the surface of the footings, the silicon substrate and the field oxide regions;

depositing a first layer of polysilicon film overlying the gate oxide layer;

patterning the gate oxide layer and the first polysilicon film to furnish CMOS footings for prospectively bearing a CMOS gate, removing the gate oxide layer and the first polysilicon film from the silicon substrate and field oxide region surfaces in locations other than CMOS footing locations;

depositing a second layer of polysilicon film overlying the surface of the silicon substrate, field oxide regions and the bipolar and CMOS footings;

patterning the second layer of polysilicon film to form a base electrode, an emitter electrode, a collector electrode, a gate, and CMOS source/drain openings including selectively etching the second layer of polysilicon film so that the bottom surface of the bipolar emitter has a medial opening abutting the surface of the silicon substrate and lateral edges abutting the bipolar and CMOS footings and a bottom of the CMOS gate abuts the surface of the first layer of polysilicon film;

removing the bipolar footings, leaving lateral notches at the bottom of the bipolar emitter;

depositing a third layer of polysilicon film overlying the surface of the second polysilicon film layer, the CMOS gate and the bipolar emitter and filling the lateral notches;

etching back the third layer of polysilicon film, leaving the third layer of polysilicon film as bipolar emitter and CMOS gate sidewalls and filling the lateral notches of the CMOS emitter; and implanting ions in the silicon substrate.

22. A method as in claim 21, wherein the silicon dioxide layer is formed to a thickness of approximately 100 Å to 200 Å.

23. A method as in claim 21, wherein the oxide protecting layer is deposited to a thickness of approximately 200 Å to 400 Å.

24. A method as in claim 21, wherein the oxide protecting layer is a silicon nitride layer.

25. A method as in claim 24, wherein the step of removing the bipolar footings includes the steps of:

stripping the silicon nitride layer; and etching the silicon dioxide layer.

26. A method as in claim 24, wherein the step of patterning the silicon dioxide layer and oxide protecting layer includes the steps of:

applying a photoresist layer over the silicon dioxide and silicon nitride layers;

selectively exposing the photoresist layer;

stripping the silicon nitride; and wet etching the silicon dioxide.

27. A method as in claim 21, wherein the oxide protecting layer is a polysilicon layer.

28. A method as in claim 26, wherein the step of removing the bipolar footings includes the step of etching the silicon dioxide layer.

29. A method as in claim 27, wherein the step of patterning the silicon dioxide layer and the oxide protecting layer includes the steps of:

applying a photoresist layer over the silicon dioxide and silicon nitride layers;

selectively exposing the photoresist layer; and wet etching the silicon dioxide.

30. A method as in claim 21, wherein the gate oxide layer is formed to a thickness of approximately 100 Å to 200 Å.

31. A method as in claim 21, wherein the first layer of polysilicon film is deposited by low pressure chemical vapor deposition (LPCVD) to a substantially minimum thickness of less than approximately 500 Å.

32. A method as in claim 21, wherein the gate oxide layer patterning step includes wet etching.

33. A method as in claim 21, wherein the first polysilicon film layer patterning step includes dry etching.

34. A method as in claim 21, wherein the second polysilicon layer is deposited to a thickness of approximately 0.1μ to 0.5μ.

35. A method as in claim 21, wherein the step of patterning the second layer of polysilicon film to form the base electrode, the collector electrode, the gate, and CMOS source/drain openings selectively over-etches the polysilicon film to an endpoint in the silicon substrate.

36. A method as in claim 21, wherein the step of patterning the second layer of polysilicon film to form the emitter electrode selectively etches the polysilicon film to an endpoint substantially at the silicon dioxide layer.

37. A method as in claim 21, wherein the step of removing the footings includes wet etching the silicon dioxide layer.

38. A method as in claim 21, wherein the third layer of polysilicon film is deposited by low pressure chemical vapor deposition (LPCVD) to a substantially minimum thickness of less than approximately 500 Å.

39. A method as in claim 21, further comprising the steps subsequent to the oxide protecting layer depositing step and precedent to the silicon dioxide and silicon nitride layer patterning step, including the steps of:

depositing a chemical vapor disposition (CVD) oxide layer overlying the silicon nitride layer by chemical vapor deposition;

patterning the CVD oxide layer to furnish footings for prospectively bearing edges of the emitter, retaining the silicon dioxide and silicon nitride layers;

depositing a spacer material layer overlying the CVD oxide layer and the silicon nitride layer; and etching back the spacer material layer, leaving the spacer material layer as CVD oxide sidewalls.

40. A method as in claim 39, wherein the step of patterning the CVD oxide layer includes the step of etching the CVD oxide layer using dry etching.

41. A method as in claim 39, wherein the spacer material is an oxide.

42. A method as in claim 39, wherein the spacer material is polysilicon.

* * * * *

UNITED STATES PATENT AND TRADEMARK OFFICE
CERTIFICATE OF CORRECTION

PATENT NO.    :   5,786,222
ISSUE DATE    :   July 28, 1998
INVENTOR(S)   :   Darmawan, Johan A.

It is certified that error appears in the above-identified patent and that said Letters Patent is hereby corrected as shown below:

On the title page, item [22]:

In the Filing Date, please delete "August 30, 1996"
        and insert --May 29, 1996--

Signed and Sealed this

Tenth Day of August, 1999

Attest:

Q. TODD DICKINSON

*Attesting Officer*       *Acting Commissioner of Patents and Trademarks*